(12) United States Patent
Yamashita

(10) Patent No.: US 11,920,068 B2
(45) Date of Patent: Mar. 5, 2024

(54) METHOD OF MANUFACTURING WAVELENGTH CONVERSION MEMBER AND WAVELENGTH CONVERSION MEMBER

(71) Applicant: NICHIA CORPORATION, Anan (JP)

(72) Inventor: Toshiaki Yamashita, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 202 days.

(21) Appl. No.: 17/371,342

(22) Filed: Jul. 9, 2021

(65) Prior Publication Data

US 2022/0010202 A1 Jan. 13, 2022

(30) Foreign Application Priority Data

Jul. 13, 2020 (JP) ................................ 2020-120026
Jan. 21, 2021 (JP) ................................ 2021-008171

(51) Int. Cl.
| | | |
|---|---|---|
| C09K 11/02 | (2006.01) | |
| B28B 11/24 | (2006.01) | |
| C09K 11/08 | (2006.01) | |
| H01L 33/50 | (2010.01) | |

(52) U.S. Cl.
CPC ............ *C09K 11/02* (2013.01); *B28B 11/243* (2013.01); *C09K 11/08* (2013.01); *H01L 33/505* (2013.01); *H01L 2933/0041* (2013.01)

(58) Field of Classification Search
CPC ........ C09K 11/02; C09K 11/08; B28B 11/243
USPC ........................................................ 428/156
See application file for complete search history.

(56) References Cited

U.S. PATENT DOCUMENTS

| | | |
|---|---|---|
| 2005/0274967 A1 | 12/2005 | Martin et al. |
| 2009/0173960 A1 | 7/2009 | Martin et al. |
| 2013/0163225 A1* | 6/2013 | Nakatsu ................. G03B 33/06 362/343 |
| 2014/0146547 A1 | 5/2014 | Tsutsumi et al. |
| 2016/0104824 A1 | 4/2016 | Furuyama |
| 2016/0190418 A1 | 6/2016 | Inomata et al. |

(Continued)

FOREIGN PATENT DOCUMENTS

| | | |
|---|---|---|
| JP | 2010-157637 A | 7/2010 |
| JP | 2010157637 A * | 7/2010 |

(Continued)

OTHER PUBLICATIONS

Machine_English_translation_JP_2010157637_A; Sano, M.; Wavelength Conversion Sintered Compact and Light Emitting Apparatus Using the Same, and Method of Manufacturing the Wavelength Conversion Sintered Compact; Jul. 15, 2010; EPO; whole document (Year: 2023).*

(Continued)

*Primary Examiner* — Tahseen Khan
(74) *Attorney, Agent, or Firm* — Foley & Lardner LLP

(57) ABSTRACT

A method of manufacturing a wavelength conversion member that includes a sintered body having a light incidence face, a light emission face, and a light reflecting face different from the light incidence face and the light emission face, the method comprising: providing a sintered body containing inorganic particles and phosphor particles, and forming a plurality of recessed portions on the light reflecting face of the sintered body, which comprises acid treating the sintered body.

16 Claims, 9 Drawing Sheets

(56) References Cited

U.S. PATENT DOCUMENTS

| | | |
|---|---|---|
| 2017/0033267 A1 | 2/2017 | Tamaki et al. |
| 2017/0186923 A1 | 6/2017 | Inomata et al. |
| 2017/0241621 A1 | 8/2017 | Yamada et al. |
| 2018/0216800 A1 | 8/2018 | Yamanaka et al. |
| 2018/0226770 A1 | 8/2018 | Yamashita |
| 2019/0305512 A1* | 10/2019 | Kitajima ............... H01S 5/0087 |

FOREIGN PATENT DOCUMENTS

| | | |
|---|---|---|
| JP | 2012-074739 A | 4/2012 |
| JP | 2013-038115 A | 2/2013 |
| JP | 2013-134424 A | 7/2013 |
| JP | 2013-219123 A | 10/2013 |
| JP | 2016-076685 A | 5/2016 |
| JP | 2016-204563 A | 12/2016 |
| JP | 2017-033967 A | 2/2017 |
| JP | 2017-149929 A | 8/2017 |
| JP | 2018-128596 A | 8/2018 |
| JP | 2019-211670 A | 12/2019 |
| WO | WO-2015/020205 A1 | 2/2015 |
| WO | WO-2017/056470 A1 | 4/2017 |
| WO | WO-2019021782 A1 * | 1/2019 |

OTHER PUBLICATIONS

Machine_English_translation_WO_2019021782_A1; Murakami, T.; Wavelength Conversion Member; Jan. 31, 2019; EPO; whole document (Year: 2023).*

* cited by examiner

METHOD OF MANUFACTURING WAVELENGTH CONVERSION MEMBER AND WAVELENGTH CONVERSION MEMBER

CROSS-REFERENCE TO RELATED APPLICATIONS

This application claims priority to Japanese Patent Application No. 2020-120026, filed on Jul. 13, 2020, and Japanese Patent Application No. 2021-008171, filed on Jan. 21, 2021, the disclosures of which are hereby incorporated by reference in their entireties.

BACKGROUND

The present disclosure relates to a method of manufacturing a wavelength conversion member, and a wavelength conversion member.

In recent years, white lighting fixtures employing light sources, such as light emitting diodes, laser diodes, and the like, are widely used. White light produced by a white lighting fixture can be achieved, for example, by allowing a wavelength conversion member to convert the wavelength of the blue light emitted by a light emitting diode. Japanese Patent Publication No. 2016-204563 discloses, as a wavelength conversion member, a sintered body made by dispersing YAG phosphor particles in an alumina ceramic matrix.

SUMMARY

Such a sintered body containing phosphor particles is used, for example, as an optical part that converts the wavelength of the light incident on the light incidence face into light having a different wavelength from the wavelength of the incident light before allowing the light to exit the light emission face, and is constructed to efficiently convert the wavelength of the light by covering surface(s) other than the light incidence face and the light emission face with a reflecting member. In the description below, the term "wavelength conversion member" means a member that includes a sintered body, i.e., it can be a sintered body by itself or a sintered body in combination with another part such as a reflecting member.

In recent years, the expansion of the use of wavelength conversion members in various applications is giving rise to the need to improve the light confinement property of the surface(s) other than the light incidence face and the light emission face.

Accordingly, one of the objects of the present disclosure is to provide a method of manufacturing a wavelength conversion member that can produce a sintered body whose surface(s) other than the light incidence face and the light emission face have improved light confinement, and to provide such a wavelength conversion member.

According to one embodiment, a method is provided for manufacturing a wavelength conversion member that includes a sintered body having a light incidence face, a light emission face, and a light reflecting face different from the light incidence face and the light emission face. The method comprises: providing a sintered body containing inorganic particles and phosphor particles, and forming a plurality of recessed portions on the light reflecting face of the sintered body, which comprises acid treating the sintered body.

A method of manufacturing a wavelength conversion member according to the present disclosure constructed as above includes processes of providing a sintered body that contains inorganic particles and phosphor particles and forming a plurality of recessed portions in any light reflecting face of the sintered body by acid treating the sintered body. This can produce a sintered body whose surfaces other than the light incidence face and the light emission face have improved light confinement, and can produce a wavelength conversion member that includes the sintered body.

DETAILED DESCRIPTION

Figure 1:
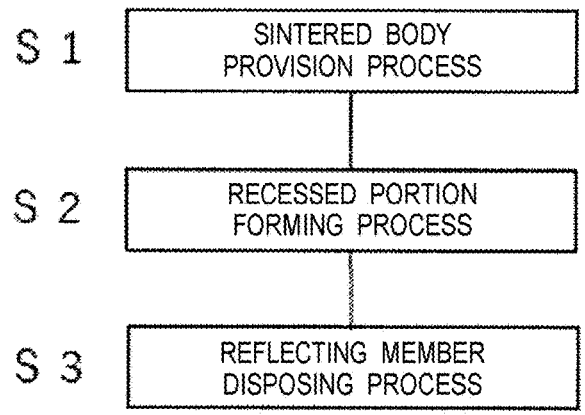
FIG. 1 is a flowchart of a manufacturing method according to Embodiment 1 of the present disclosure.

A method of manufacturing a wavelength conversion member according to the present disclosure has been developed based on the discovery that an acid treated surface of a sintered body that contains inorganic particles and phosphor particles can have improved light confinement, and the method includes at least a sintered body provision process in which a sintered body containing inorganic particles and phosphor particles is provided, and a recessed portion forming process.

The recessed portion forming process creates a plurality of recessed portions in a light reflecting face of a sintered body by acid treating the surfaces of the sintered body. More specifically, acid treating the surfaces of a sintered body allows the phosphor particles exposed in a light reflecting face of the sintered body to break loose, creating a plurality of recessed portions in the light reflecting face of the sintered body composed of the remaining inorganic particles. By creating a plurality of recessed portions in a light reflecting face of the sintered body as described above, the light reflecting face can have improved light confinement. This is believed to be attributable to the refractive index difference between the inorganic particles and the air in the recessed portions in the light reflecting face. It is also believed to be attributable to the reduced number of exposed phosphor particles in the light reflecting face.

A method of manufacturing a wavelength conversion member according to the present disclosure can include either of the processes described below, as needed, in order to suppress the faces of the sintered body utilized as the light incidence face and the light emission face from confining light:

(a) subsequent to the recessed portion forming process, a recessed portion removal process in which recessed portions are removed from the faces to be used as the light incidence face and the light emission face among the surface(s) provided with recessed portions by acid treatment, and (b) prior to the recessed portion forming process, a mask forming process in which masks are formed on the faces to be used as the light incidence face and the light emission face so as not to expose the light incidence face and the light emission face to acid treatment.

A method of manufacturing a wavelength conversion member according to the present disclosure can make a surface of a sintered body a light reflecting face having improved light confinement, except for the light incidence face and the light emission face. In the sintered body produced in this manner, the leakage of light from the surface(s) can be reduced except for the light incidence face and the light emission face, because the surface(s) is a light reflecting face having improved light confinement. The sintered body therefore can efficiently convert the wavelength of the light incident on the light incidence face before allowing the light to exit the light emission face.

The light incidence face and the light emission face of a sintered body to be produced can be the same face or different faces.

In a method of manufacturing a wavelength conversion member according to the embodiment, by further including a reflecting member disposing process in which a reflecting member is disposed to cover in contact with the light reflecting face(s) provided with recessed portions such that the light incidence face and the light emission face are exposed, a wavelength conversion member that includes a sintered body and a reflecting member can be manufactured. The wavelength conversion member that includes a sintered body and a reflecting member can not only improve the light confinement of the light reflecting face(s) of the sintered body, but also increases the reflectance at the interface between the sintered body and the reflecting member. Thus, the light bleeding around the edges of the light emission face of the sintered body can be reduced. This can increase the luminance difference between the light emission face of the sintered body and the outside of the light emission face. This can produce a wavelength conversion member having a clearly distinguishable boundary, in other words, light-dark boundary between the light emission face of the sintered body and the reflecting member surrounding the light emission face.

Methods of manufacturing wavelength conversion members according to certain embodiments will be explained in detail below based on specific examples with reference to the drawings.

The methods of manufacturing wavelength conversion members according to Embodiments 1 to 3 described below include a reflecting member disposing process, but the reflecting member disposing process is employed as needed as an option. In other words, a sintered body provided with a plurality of recessed portions in the light reflecting face produced by a method of manufacturing a wavelength conversion member according to the embodiment described above can improve the light confinement of the light reflecting face. The light reflecting face of the sintered body thus can have improved light confinement without a reflecting member that covers in contact with the light reflecting face, and the sintered body can be used as a wavelength conversion member without a reflecting member that covers the light reflecting face.

Furthermore, the methods of manufacturing wavelength conversion members according to Embodiments 1 to 3 described below give shape to the technical ideas of the embodiment described above, but are not intended to limit the present invention. In the explanation below, the same designations and reference numerals denote the same or similar members, for which redundant explanation will be omitted as appropriate. The sizes and relative positions of the members in the drawings may be exaggerated for clarity of explanation.

Embodiment 1

A method of manufacturing a wavelength conversion member 1 according to Embodiment 1, as shown in FIG. 1, includes a sintered body provision process S1, a recessed portion forming process S2, and a reflecting member disposing process S3.

1. Sintered Body Provision Process S1

Figure 2:
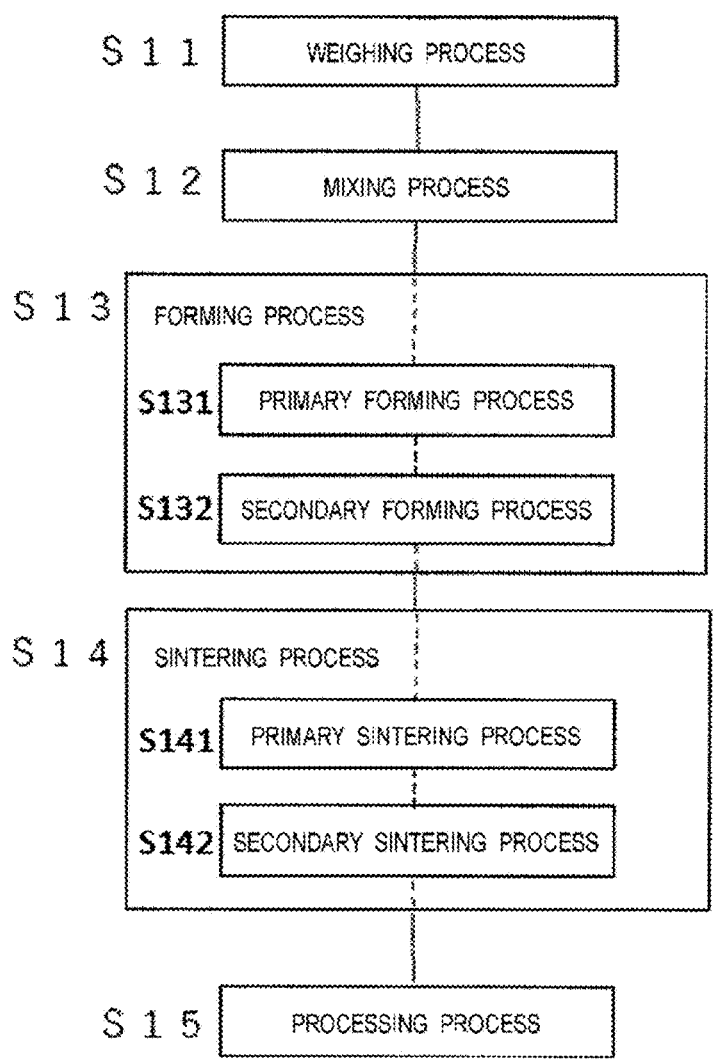
FIG. 2 is a flowchart of a sintered body provision process in the manufacturing method of Embodiment 1.

A sintered body provision process S1, as shown in FIG. 2, includes a weighing process S11, a mixing process S12, a forming process S13, a sintering process S14, and a processing process S15.

Each process will be specifically explained below.

(1-1) Weighing Process S11

Here, inorganic particles and phosphor particles are provided, and the inorganic particles and the phosphor particles thus provided are weighed to predetermined respective weights. The process of provision of phosphor particles include providing the raw materials for the phosphor particles, as an alternative to providing the phosphor particles themselves. For example, in the case of providing YAG phosphor particles, aluminum oxide, yttrium oxide, and cerium oxide particles can be respectively provided.

Phosphor particles are excited by incident light and emit light having a longer wavelength than that of the incident light. The inorganic particles hold the phosphor particles in place when sintered.

For the phosphor particles, for example, those composed of one or more selected among cerium-activated YAG-based (yttrium aluminum garnet) phosphors, europium and/or chromium-activated nitrogen-containing calcium aluminosilicate-based ($CaO$—$Al_2O_3$—$SiO_2$) phosphors, europium-activated silicate-based (($Sr,Ba)_2SiO_4$) phosphors, α-SiAlON-based phosphors, and β-SiAlON-based phosphors are provided. It is preferable to use a material having a relatively high heat resistance and resistance to degradation by excitation light for the phosphor particles. Examples of suitable materials include YAG phosphors. Here, YAG phosphors include, for example, one in which at least a portion of Y is replaced with Tb, or one in which at least a portion of Y is replaced with Lu. YAG phosphors can contain Gd, $Ga_2$, or the like in the compositions.

The particle size of the phosphor particles to be provided preferably is, for example, in the 0.1 μm to 30 μm range, more preferably in the 1 μm to 5 μm range. These ranges can further improve the light confinement property of the surfaces of the sintered body 11 following an acid treatment. Inorganic particles having a lower sintering temperature than the sintering temperature of the phosphor particles are used. In this manner, the inorganic particles can be sintered while reducing the thermal degradation of the phosphor particles.

For the inorganic particles, for example, those composed of one or more selected among oxides such as aluminum oxide or yttrium oxide, or nitrides are provided. For the inorganic particles, it is preferable to use a material having a thermal expansion coefficient similar to a thermal expansion of the phosphor particles or a material with low light absorption. Examples of suitable materials include aluminum oxide.

The particle size of the inorganic particles to be provided is preferably smaller than the particle size of the phosphor particles, for example, in the 0.01 μm to 1 μm range, more preferably in the 0.3 μm to 0.6 μm range. Selecting a smaller particle size than the phosphor particles in addition to selecting an appropriate material for the inorganic particles can reduce the sintering temperature for the inorganic particles to be lower than the sintering temperature of the phosphor particles. This can sinter the inorganic particles while reducing the thermal degradation or abnormal particle growth of the phosphor particles. An excessively small particle size might allow the inorganic particles to agglomerate, which can pose handling difficulty, or uneven mixing, which results in ununiform sintering. From this standpoint, the particle size of the inorganic particles is preferably at least 0.1 μm.

The particle size here refers to the average particle size based on the measurement using a laser diffraction method.

Subsequently, the inorganic particles and the phosphor particles thus provided are weighed.

The inorganic particles and the phosphor particles are measured to have predetermined weight percentages relative to the total weight. Here, the weight percentage of the inorganic particles relative to the total weight of the inorganic and phosphor particles is suitably set to achieve predetermined wavelength conversion characteristics, for example, in the 20% to 95% range, preferably in the 60% to 90% range, more preferably in the 70% to 80% range.

Suitably selecting the particle sizes of the phosphor particles and the inorganic particles falling within the ranges specified above, and selecting the quantities of the phosphor particles and the inorganic particles falling within the ranges specified above, can scatter the phosphor particles in the inorganic particles having a relatively small particle size, thereby producing a sintered body 11 in which the phosphor particles are supported by the inorganic matrix formed by sintered inorganic particles in the processes described below.

(1-2) Mixing Process S12

Subsequently, the weighed inorganic particles and the phosphor particles are mixed, for example, by placing them in a mixing vessel together with alumina balls and rotating the vessel (ball milling). Ball milling can be wet ball milling using a solvent such as ethanol, or dry ball milling without a solvent.

(1-3) Forming Process S13

Here, the mixed powder, i.e., the mixture of the inorganic particles and the phosphor particles, is formed to have a predetermined shape.

The forming process S13 includes, for example, a primary forming process S131 and a secondary forming process S132.

In the primary forming process S131, the mixed powder is pressed from top and bottom by press forming or the like. In the secondary forming process S132, a predetermined shape is given to the primarily formed component by CIP (cold isostatic pressing) or the like so as to achieve uniform density.

(1-4) Sintering Process S14

In a sintering process, in the case in which the inorganic particles are aluminum oxide, for example, the formed body is held at a predetermined sintering temperature in the 1300° C. to 1600° C. range for a certain period, whereby a matrix-shaped support for supporting the phosphor particles is formed by the sintered inorganic particles. The sintering process S14, for example, includes a primary sintering process S141 performed at a predetermined temperature and atmospheric pressure, and a secondary sintering process S142 that allows the sintered body to have a higher density than in the primary sintering process S141. In the primary sintering process S141, spark plasma sintering (SPS) can be used. In the secondary sintering process S142, hot pressing (HP) or hot isostatic pressing (HIP) can be used. The sintering temperature and time can be suitably set so as to sinter the inorganic particles with reduced thermal degradation and abnormal particle growth of the phosphor particles.

The sintering temperature and time here are suitably set by considering the particle sizes of the inorganic particles and the phosphor particles before sintering so as to achieve predetermined particle sizes of the inorganic particles and the phosphor particles after sintering. In the case of selecting a YAG-based phosphor for the phosphor particles, aluminum oxide for the inorganic particles, and employing hot pressing, sintering is performed, for example, at a temperature in the 1350° C. to 1600° C. range for the retention time at that temperature in the 30 to 600 minute range.

The crystal particle size of the phosphor particles of the sintered body 11 can be measured, for example, by obtaining the average of the smallest and largest widths of the phosphor particles having shapes close to a circle in an SEM image scaled to capture 10 phosphor particles. In the explanation and the drawings referenced below, reference numeral 17 denotes the phosphor particles in the sintered body 11.

(1-5) Processing Process S15

Figure 3A:
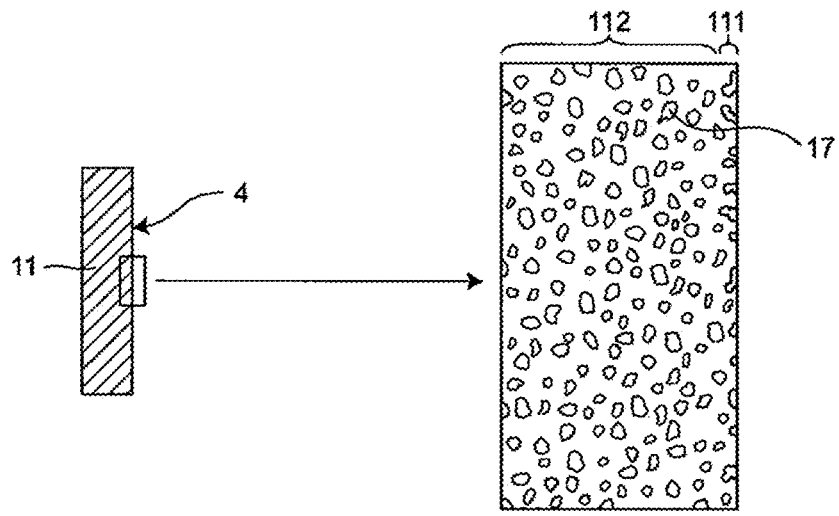
FIG. 3A is a cross-sectional view of a sintered body provided by the manufacturing method of Embodiment 1.

The sintered body 11 thus obtained is processed as needed to have a predetermined shape. Here, the sintered body is processed to have a quadrangular prism shape of a predetermined size, as shown in FIG. 3A, for example. The surfaces of the processed sintered body 11, as shown in FIG. 3A, are substantially flat. Here, substantially flat in the description refers to the normal surface condition of a sintered body not subjected to grinding or polishing after sintering.

2. Recessed Portion Forming Process S2

Figure 3B:
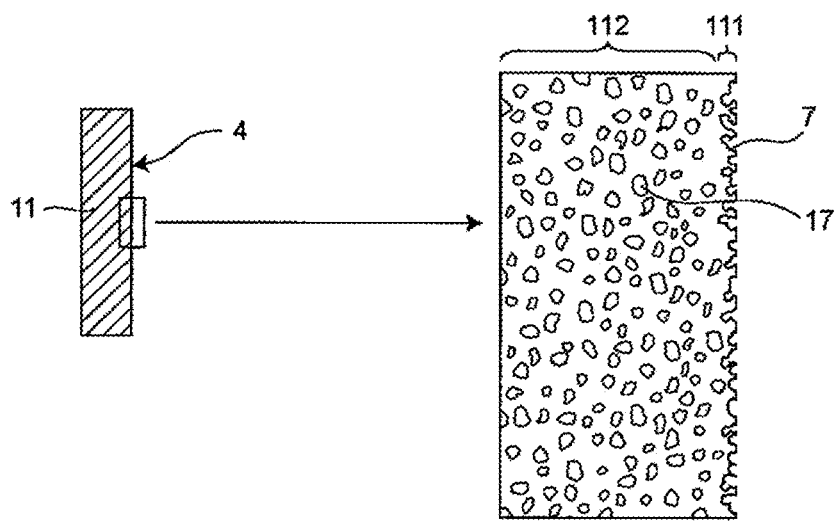
FIG. 3B is a cross-sectional view of the sintered body after creating recessed portions in the manufacturing method of Embodiment 1.
Figure 3C:
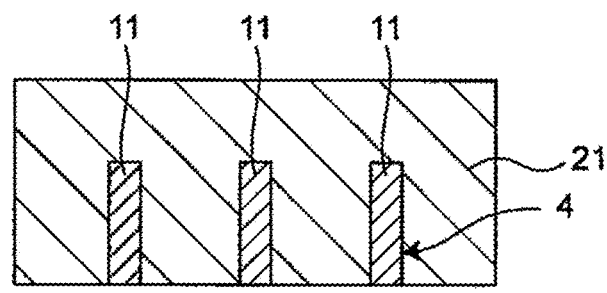
FIG. 3C is a cross-sectional view of sintered bodies provided with recessed portions surrounded by a reflecting member in the manufacturing method of Embodiment 1.
Figure 3D:
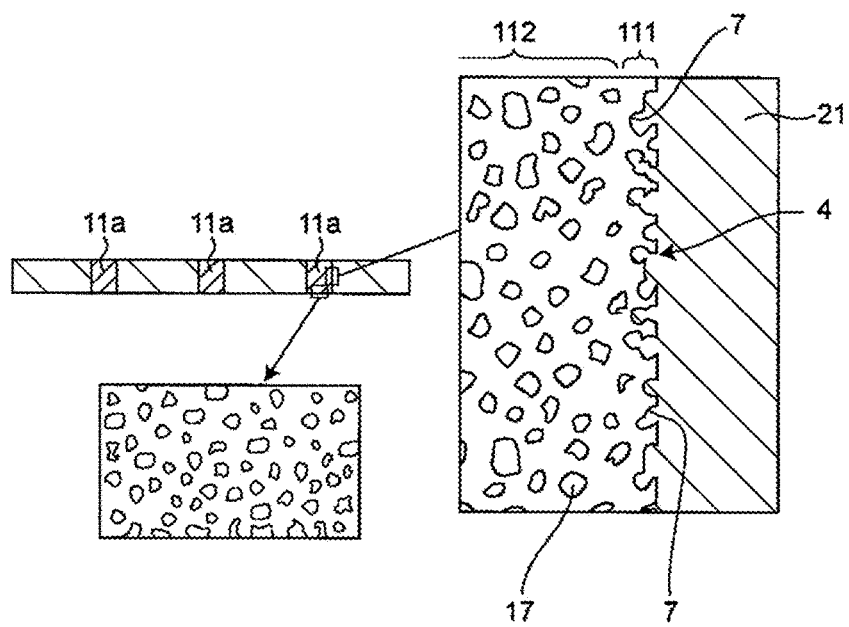
FIG. 3D is a cross-sectional view of a wavelength conversion member block after processing the reflecting member that includes sintered bodies provided with recessed portions in the manufacturing method of Embodiment 1.
Figure 3E:
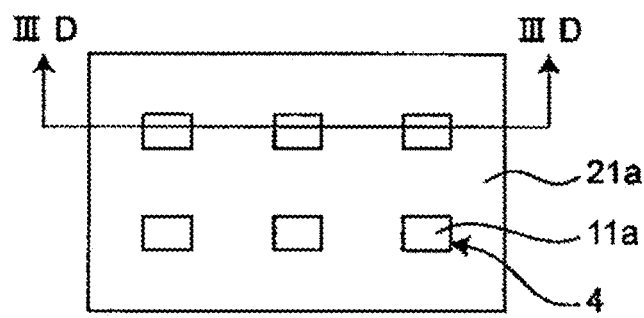
FIG. 3E is a top view of the wavelength conversion member block shown in FIG. 3D.
Figure 3F:
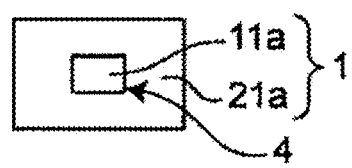
FIG. 3F is a top view of a wavelength conversion member after dividing the wavelength conversion member block into individual pieces in the manufacturing method of Embodiment 1.

In a recessed portion forming process S2, the sintered body 11 provided by the sintered body provision process S1 is acid treated to form a plurality of recessed portions 7 in the surfaces of the sintered body 11, as shown in FIG. 3B.

Here, a solution that dissolves at least either the phosphor particles 17 or the inorganic particles is used. Preferably, a solution that results in a higher dissolution rate for the phosphor particles 17 than the dissolution rate for the inorganic particles is used. Examples of such solutions include phosphoric acid, sulfuric acid, hydrofluoric acid, and nitric acid.

The acid treatment is performed, for example, in a heated phosphoric acid and sulfuric acid mixture for a predetermined time, followed by washing with water. The ratio of phosphoric acid to sulfuric acid, the heating temperature for the mixture, and the treating time are suitably set by taking into consideration the targeted shapes and sizes of the recessed portions 7. For example, the ratio of phosphoric acid to sulfuric acid is in a range from 1:1 to 1:5, the heating temperature for the mixture is in a range from 100° C. to 320° C., and the treating time is in a range from 1 minute to 60 minutes. The acid treatment described above first dissolves the fused boundaries between the inorganic particles and the phosphor particles 17 at a surface of the sintered body 11, granularizing them again. In other words, the fused boundaries between the inorganic particles and the phosphor particles 17 dissolve first to allow them to regain a particle state. Then the phosphor particles 17 break loose, creating recessed portions 7 in the surfaces of the sintered body 11.

For example, in the case of acid treating a sintered body 11 containing YAG phosphor particles 17 and aluminum oxide inorganic particles using a phosphoric acid and sulfuric acid mixture in the 36:74 ratio, because YAG dissolves at 200° C. while the aluminum oxide begins dissolving at about 260° C., the temperature of the mixture is set, for example, in the 280° C. to 305° C. range. Because a dissolution rate of YAG is higher than a dissolution rate of aluminum oxide, the surfaces of the phosphor particles 17 at the fused boundaries between the inorganic particles and the phosphor particles 17 dissolve first, separating them apart and allowing the phosphor particles 17 to break loose from the inorganic particles, whereby recessed portions 7 are created at the surfaces of the sintered body 11.

A plurality of recessed portions 7 are created in the light reflecting faces 4 of the sintered body 11 in the manner described above. In the acid treated sintered body 11, the phosphor particles 17 are less distributed in the light reflecting faces 4 than the inside of the sintered body 11.

In the case of a sintered body 11 by itself, the distribution of the phosphor particles 17 in a light reflecting face 4 can be obtained as a percentage of an area of the phosphor particles 17 relative to an area of the light reflecting face 4 by analyzing an SEM image of the light reflecting face 4. The distribution of the phosphor particles 17 on the inside of the sintered body 11 can be obtained as a percentage of an area of the phosphor particles 17 relative to a cross sectional area of the sintered body 11 by analyzing an SEM image of the cross section of the sintered body 11 that includes the central axis of the sintered body 11.

Figure 3G:
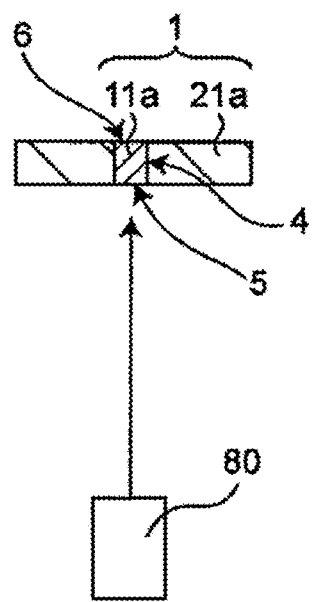
FIG. 3G is a schematic view of an application example of a wavelength conversion member provided by the manufacturing method of Embodiment 1.
Figure 3H:
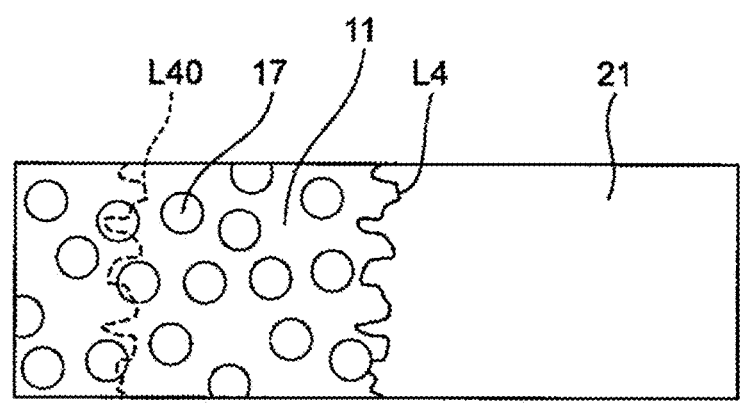
FIG. 3H is a simplified schematic cross section explaining a method of evaluating the phosphor particle distribution in the sintered body.

When it is difficult to directly observe a light reflecting face 4 using an SEM image such as in the case of a wavelength conversion member 1 that includes a sintered body 11 and a reflecting member 21, the distribution of the phosphor particles can be obtained by the method described below. The distribution of the phosphor particles 17 in a light reflecting face 4 can be obtained by analyzing an SEM image of a cross section of the sintered body 11 crossing the light reflecting face 4 schematically shown in FIG. 3H as a ratio of the length of the line L4 overlapping the phosphor particles 17 to the length of the line L4 along the light reflecting face 4. The distribution of the phosphor particles 17 on the inside of the sintered body 11 can be obtained by analyzing the imaginary line L40 corresponding with the line L4 along the light reflecting face 4 defined in an SEM image of the cross section of the sintered body 11 that includes the central axis of the sintered body 11, as a ratio of the length of the portion of an imaginary line L40 overlapping the phosphor particles 17 to the length of the imaginary line L40 that corresponds with the line L4. Here, FIG. 3H is an enlarged view of a portion of the area subject to the image analysis, and it goes without saying that the actual area to be analyzed using an SEM image to obtain the distribution should be set using a certain scale such that the distribution would not differ depending on the position analyzed, for example, scaled to capture 100 pieces of the phosphor particles 17. The distribution of the phosphor particles 17 in a light reflecting face 4, for example, is no more than 0.3 times, preferably no more than 0.1 times, the distribution of the phosphor particles 17 on the inside of the sintered body 11, more preferably substantially zero. Such a phosphor particle distribution, i.e., a higher inorganic particle distribution in the light reflecting face(s) 4 of the sintered body 11, can improve the light confinement of the light reflecting face(s) 4 of the sintered body 11. This is believed to be attributable to the refractive index difference between the inorganic particles and the pores 9 in the recessed portions 7. It is also believed to be attributable to the reduced number of the phosphor particles 17 exposed at the light reflecting face(s) 4 of the sintered body 11. FIG. 3H is a simplified schematic diagram for explaining a method of evaluating the distribution of the phosphor particles 17. Although it is a cross-sectional view, hatching lines are omitted so as to make the line L4 and the imaginary line L40 visible. In FIG. 3H, moreover, the phosphor particles 17 are drawn as circles having the same diameter, but the individual phosphor particles 17 have different sizes and shapes in reality.

In other words, in the sintered body 11, the phosphor particles 17 are less distributed in a peripheral portion 111 that includes a light reflecting face 4 than in the internal portion 112 inward of the peripheral portion 111. Here, the peripheral portion 111 that includes a light reflecting face 4 refers to the portion up to a certain distance inward of the light reflecting face 4. A certain distance depends on the conditions such as acid treatment temperature and time, but refers to, for example, 5 µm to 20 µm. The density of the phosphor particles 17 in the peripheral portion 111 that includes a light reflecting face 4 of the sintered body 11 is, for example, no more than 0.3 times, preferably no more than 0.1 times, the density of the phosphor particles 17 in the internal portion 112, more preferably substantially zero density. Such a phosphor particle distribution, i.e., a higher inorganic particle distribution in the peripheral portion 111 that includes a light reflecting face 4 of the sintered body 11, can improve the light confinement of the light reflecting face(s) 4 of the sintered body 11. This is believed to be attributable to the refractive index difference between the inorganic particles and the pores 9 in the recessed portions 7. It is also believed to be attributable to the reduced number of the phosphor particles 17 exposed at the light reflecting face(s) 4 of the sintered body 11. This can reduce color unevenness in the peripheral portion 111 and the internal portion 112 of the sintered body 11 when light is irradiated on the sintered body 11.

As a result of the phosphor particles 17 broken loose from the sintered body 11 by the acid treatment described above, pores 9 surrounded by the sintered body 11 are created in the peripheral portion 111 that includes a light reflecting face 4 of the sintered body 11. This can further improve the light confinement of the light reflecting face 4 of the sintered body 11. Here, surrounded by the sintered body 11 refers to the presence of the sintered body 11 around 40% to 80% of the perimeter of a pore 9.

The porosity in the peripheral portion 111 that includes a light reflecting face 4 of the sintered body 11 is preferably in a range of 5% to 30%. This can improve the light confinement of a light reflecting face 4 while maintaining the strength of the sintered body 11.

3. Reflecting Member Disposing Process S3

Here, a reflecting member 21 is disposed in contact with and to surround the outer lateral faces of the quadrangular prism shaped sintered body 11 with the recessed portions 7 created in the surfaces. Here, the outer lateral faces of the sintered body 11 are light reflecting faces 4.

For example, a powder material for a reflecting member 21 is integrally formed so as to surround a quadrangular prism shaped sintered body 11 and sintered. The powder material for the reflecting member 21 can be formed to surround a sintered body 11 disposed at a predetermined position by, for example, slip casting, doctor blading, or the like. Pressure can be applied during or subsequent to forming so as to increase the density of the packed powder. This produces a wavelength conversion member 1 in which a quadrangular prism shaped sintered body 11 and a reflecting member 21 are integrated. When sintering the powder for the reflecting member 21, the shape of the quadrangular prism shaped sintered body 11, including the recessed portions 7 formed on the surfaces, remains unchanged even when integrated with the reflecting member 21 because the sintered body 11 has already been sintered. After disposing the reflecting member 21, the surfaces other than the light reflecting faces 4 of the sintered body 11 covered by the reflecting member 21, i.e., the surfaces exposed from the reflecting member, can be ground or polished in part or whole as needed to remove the recessed portions 7 formed on the surfaces.

The reflecting member 21 is preferably formed with materials that include the same material as the inorganic particles of the sintered body 11. For example, aluminum oxide as a primary material together with a material having a different refractive index from the refractive index of aluminum oxide can be used.

Here, in the case of forming a reflecting member using powder by slip casting, doctor blading, or the like, for example, the powder for the reflecting member might penetrate some or all of the recessed portions 7 of the sintered body 11. In this case, at the boundary between a light reflecting face 4 of the sintered body 11 and the reflecting member 21a, an intermediate portion is formed that includes the recessed portions 7 of the sintered body 11, the protrusions 8 of the reflecting member 21a at least partially extending into the recessed portions 7, and pores 9 formed between the recessed portions 7 and the protrusions 8. Here, although it depends on the conditions such as the acid treatment temperature and time, the intermediate portion refers to the portion up to a certain distance from the boundary of the light reflecting face 4 of the sintered body 11 and the reflecting member 21a into both the sintered body 11 and the reflecting member 21a, respectively. The certain distance depends on conditions such as acid treatment temperature and time, but refers to, for example, a distance in a range of 3 µm to 10 µm.

Figure 7A:
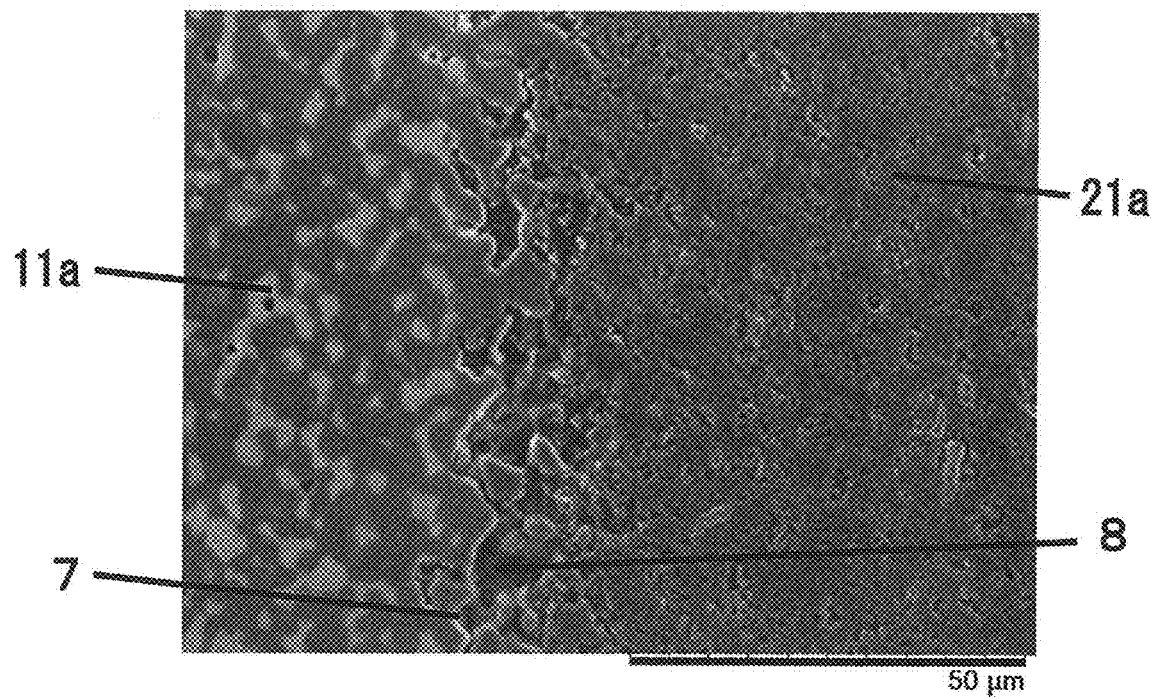
FIG. 7A is a cross-sectional micrograph of a sintered body provided in a similar manner as in the test example after forming a reflecting member on the light reflecting face.
Figure 7B:
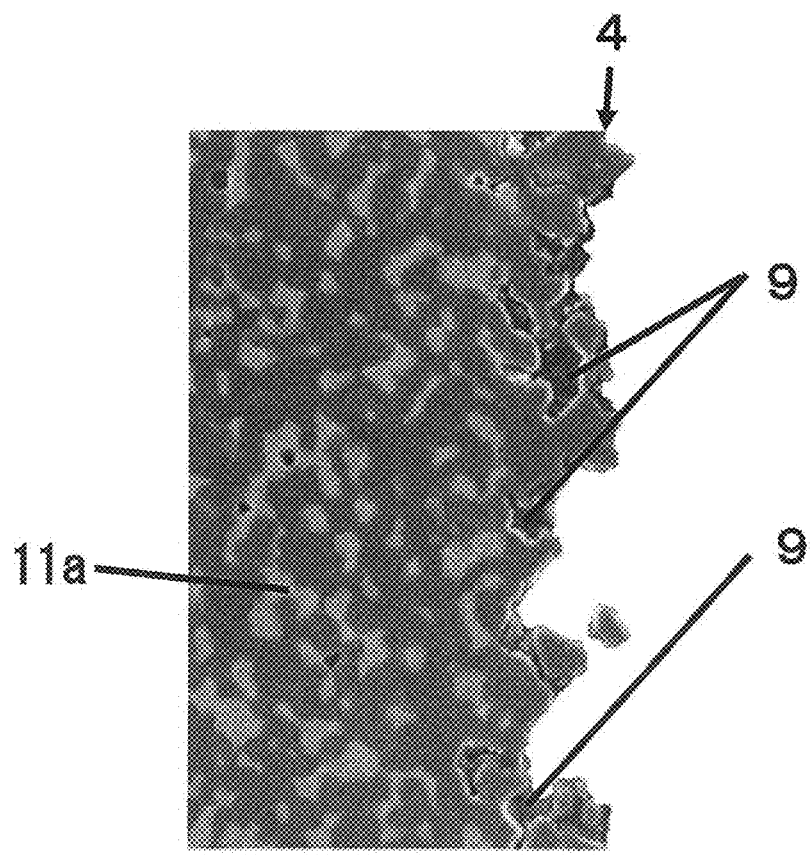
FIG. 7B is a cross-sectional micrograph of the sintered body shown in FIG. 7A from which the reflecting member is removed.

The recessed portions 7 of the sintered body 11, the protrusions 8 of the reflecting member 21a, and the pores 9 formed between the recessed portions 7 and the protrusions 8 are not shown in the schematic diagram, but are shown in FIG. 7A and FIG. 7B.

Here, in the reflecting member disposing process S3, as shown in FIG. 3C to FIG. 3F, a wavelength conversion member block in which a plurality of wavelength conversion members 1 are collectively produced can be provided. A dividing process can be included to subsequently divide the wavelength conversion block into individual wavelength conversion members 1. Each wavelength conversion member 1 following the dividing process includes one or more sintered bodies 11a. Specifically, a wavelength conversion member 1 shown in FIG. 3F can be obtained by processing the wavelength conversion member block shown in FIG. 3C into multiple wavelength conversion member blocks of a predetermined thickness each including multiple wavelength conversion members 1 shown in FIG. 3D and FIG. 3E, and further dividing each wavelength conversion member block. Processing the wavelength conversion member block into multiple blocks having a predetermined thickness and further dividing them into individual pieces in this manner can remove the recessed portions 7 of the surfaces of the sintered bodies 11a exposed at the processed faces of each wavelength conversion member 1, thereby reducing light confinement. Accordingly, the surfaces can be used, for example, as a light incidence face 5 or a light emission face 6 without separately performing a process of removing the recessed portions 7. Because each wavelength conversion member block is processed to a predetermined thickness, in the case in which a wavelength conversion member 1 includes 2 or more sintered bodies 11a, the light incidence faces and/or the light emission faces of the sintered bodies 11a are substantially coplanar.

A wavelength conversion member 1 produced as described above includes a sintered body 11a and a reflecting member 21a, in which the lateral faces of the sintered body 11a are covered by the reflecting member 21a, and the upper face and the lower face of the sintered body 11a are exposed from the reflecting member 21a. In other words, portions of the inner lateral faces of the reflecting member 21a are in contact with the outer lateral faces of the sintered body 11a, while the light incidence face and the light emission face of the sintered body 11a are exposed from the reflecting member 21a. In this manner, as shown in FIG. 3G, for example, the lower face of the sintered body 11a can be used as a light incidence face 5 through which the light from a light emitting element 80 such as a laser diode enters, and the upper face as the light emission face 6 through which the light subjected to wavelength conversion exits. In the case of using the lower face and the upper face of the sintered body 11a as the light incidence face 5 and the light emission face 6 as described above, a recessed portion removal process is preferably included subsequent to the recessed portion forming process S2 to remove the recessed portions 7 from the light incidence face 5 and/or the light emission face 6 in order to reduce the light confinement of the light incidence face 5 and the light emission face 6. In Embodiment 1, the processing process described above in the process of forming a wavelength conversion member 1 also performs the recessed portion removal process.

Moreover, in the wavelength conversion member 1 as constructed above, the light reflecting faces 4 of a sintered body 11a have a plurality of recessed portions 7, and the faces of the light reflecting member 21a opposing the light reflecting faces 4 of the sintered body 11a have a plurality of protrusions 8. At least a portion of the protrusions 8 of the reflecting member 21a penetrate the recessed portions 7 created in the light reflecting faces 4 of the sintered body 11a, and pores 9 are present in at least some of the recessed portions 7. In other words, at the boundary between a light reflecting face 4 of the sintered body 11a and the opposing face of the reflecting member 21a, an intermediate portion in which a plurality of recessed portions 7, a plurality of protrusions 8 and pores 9 are present. The intermediate portion allows the interfaces between the protrusions 8 of the reflecting member 21a and the inorganic particles providing the recessed portions 7 of the sintered body 11a or the pores 9 to reduce the propagation of the light from the sintered body 11a, thereby increasing the luminance difference between the light emission face 6 of the sintered body 11a and the area around the light emission face 6 in a top view. Furthermore, in the case of using the lower face of the sintered body 11a as the light incidence face 5 and the upper face as the light emission face 6, an optical thin film such as a DBR (distributed Bragg reflector) can be formed on the light incidence face 5 of the sintered body 11a.

In the case of a wavelength conversion member 1 produced by following the processes described above, the light confinement of the light reflecting faces 4 of the sintered body 11a covered by the reflecting member 21a is improved because the light reflecting faces 4 have a plurality of recessed portions 7 created via acid treatment. Accordingly, when the upper face of the sintered body 11a surrounded by the reflecting member 21a is used as the light emission face 6, a large luminance difference between the light emission face 6 and the reflecting member 21a around the light emission face 6, i.e., the rate of decrease in luminance with respect to the distance from the light emission face 6 can be made sharper in the upper face of the wavelength conversion member 1 (the face that includes the light emission face 6 of the sintered body 11a), thereby producing a clearly distinguishable boundary.

The wavelength conversion member 1 produced as described above can be used, for example, as a lid, or a part of a lid, of a package that houses a light emitting diode or semiconductor laser element, allowing the light from the light emitting diode or semiconductor laser element housed in the package to be output after undergoing wavelength conversion.

Embodiment 2

A method of manufacturing a wavelength conversion member 2 according to Embodiment 2, similar to a method of manufacturing a wavelength conversion member 1 according to Embodiment 1, includes a sintered body provision process S1, a recessed portion forming process S2, and a reflecting member disposing process S3 with some differences in the specifics of each process.

A method of manufacturing a wavelength conversion member 2 according to Embodiment 2 will be explained in detail below.

1. Sintered Body Provision Process S1

A sintered body provision process S1, similar to Embodiment 1, includes (1-1) Weighing Process S11, (1-2) Mixing Process S12, (1-3) Forming Process S13, (1-4) Sintering Process S14, and (1-5) Processing Process S15 shown in FIG. 2.

In Embodiment 2, (1-1) Weighing Process S11 and (1-2) Mixing Process S12 are similar to those in Embodiment 1.

In Embodiment 2, a plate-shaped formed body having a predetermined thickness is formed in (1-3) Forming Process S13 by using the inorganic particles and the phosphor particles that are weighed and mixed.

In Embodiment 2, for example, in the forming process S13, a resin binder and a solvent are added to the mixed powder of the inorganic particles and the phosphor particles, and stirred to make a slurry. A film of a predetermined thickness is formed with the slurry, and is cut into a predetermined shape to form a plate shaped green body. In the forming process of Embodiment 2, a plate shaped body can be formed by press forming and/or CIP (cold isostatic pressing) in a similar manner as in Embodiment 1.

The thickness of a plate shaped formed body is set by taking the sintering induced contraction into consideration so as to achieve a desired thickness after sintering.

Subsequently, in (1-4) Sintering Process S14, similar to Embodiment 1, the plate shaped formed body is sintered to produce a phosphor ceramic plate 12, which is a sintered body.

(1-5) Processing Process S15

Figure 4A:
FIG. 4A is a cross-sectional view of a sintered body provided in a manufacturing method according to Embodiment 2.

As shown in FIG. 4A, a plurality of circular truncated cone-shaped protrusions 12a are formed on the upper face of the phosphor ceramic plate 12 thus obtained. The protrusions 12a can be formed, for example, by using a machining center. In the phosphor ceramic plate 12, the portion excluding the protrusions 12a will be referred to as the base 12b.

2. Recessed Portion Forming Process S2

In Embodiment 2, the recessed portion forming process S2 includes:
  (i) an acid treatment process in which recessed portions 7 are formed across all surfaces of the phosphor ceramic plate 12 by acid treating the entire phosphor ceramic plate 12, and
  (ii) a second processing process in which the phosphor ceramic plate 12 is separated into sintered bodies 12a having predetermined shapes after removing the recessed portions 7 on predetermined faces.

(2-1) Acid Treatment Process

Figure 4B:
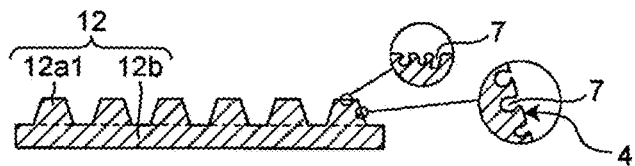
FIG. 4B is a cross-sectional view of the sintered body provided with recessed portions in the manufacturing method of Embodiment 2.

In the recessed portion forming process S2 of Embodiment 2, the acid treatment process creates a plurality of recessed portions 7 on all surfaces of the phosphor ceramic plate 12, including the surfaces of the protrusions 12a, as shown in FIG. 4B, by acid treating the entire phosphor ceramic plate 12 with the protrusions 12a. The acid treatment is performed in a similar manner as in Embodiment 1.

(2-2) Second Processing Process

Figure 4C:
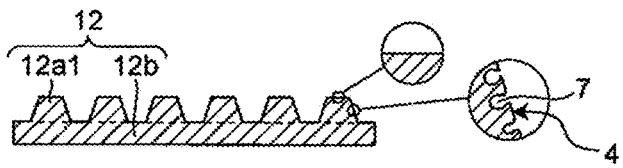
FIG. 4C is a cross-sectional view of the sintered body after removing some of the recessed portions in the manufacturing method of Embodiment 2.
Figure 4D:
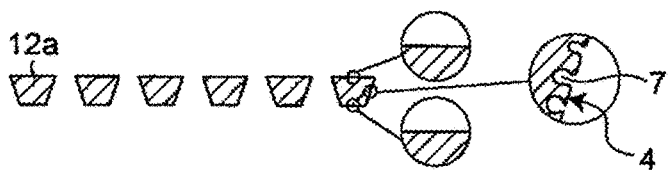
FIG. 4D is a cross-sectional view of sintered bodies resulting from separating the protrusions of the sintered body into individual pieces in the manufacturing method of Embodiment 2.
Figure 4E:
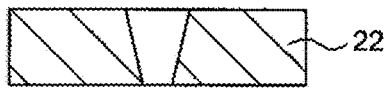
FIG. 4E is a cross-sectional view of a reflecting member provided in the manufacturing method of Embodiment 2.

In a second processing process, by grinding the upper faces of the circular truncated cone-shaped protrusions 12a, the recessed portions 7 created in the upper faces are removed to flatten the upper faces as shown in FIG. 4C.

Then by grinding the lower face of the phosphor ceramic plate 12, the base 12b is removed to separate the circular truncated cone-shaped protrusions 12a into individual pieces.

By following the processes described above, circular truncated cone-shaped sintered bodies 12a in which the upper and lower bases are flat and the outer lateral face has recessed portions 7 created by the acid treatment are produced.

In the description, the upper base of a circular truncated cone is one of the opposing circular faces interposing the lateral face that has a smaller area, and the lower base is the other circular face having a larger area, regardless of the upper/lower positional relationship.

3. Reflecting Member Disposing Process S3

Here, a reflecting member 22 is disposed to surround an outer lateral face of a circular truncated cone-shaped sintered body 12a in contact with the outer lateral face of the sintered body 12a that has recessed portions 7 created on the surface. Here, the outer lateral face of the sintered body 12a is the light reflecting face 4.

Specifically, a reflecting member 22 having a through hole into which a circular truncated cone-shaped sintered body 12a will be inserted is separately provided. For example, a reflecting member 22 is provided by forming a powder material for forming a reflecting member 22 into a formed body having a through hole, and sintering the formed body. After sintering, the through hole can be finished to have predetermined dimensional accuracy by grinding or polishing. This can very accurately position a circular truncated cone-shaped sintered body 12a in the through hole. The through hole of the reflecting member 22 has a circular truncated cone shape substantially the same as the sintered body 12a. The through hole of the reflecting member 22 is formed such that its open upper base is smaller than the upper base of the sintered body 12a and its open lower base is larger than the lower base of the sintered body 12a. In Embodiment 2, a ceramic is used as the reflecting member 22, but for example, a metal can alternatively be used.

Here, before positioning a sintered body 12a in the through hole of the reflecting member 22, a low melting point glass can be disposed on the inner wall of the through hole. A sintered body 12a can be fixed within the through hole of the reflecting member 22 by allowing the low melting point glass to fuse the sintered body 12a to the through hole of the reflecting member 22. This can facilitate dissipation of the heat from the sintered body 12a while securely fixing the sintered body in place even when the oblique angle of the through hole of the reflecting member 22 is not the same as the oblique angle of the lateral face of the sintered body 12a. The oblique angle of the through hole of the reflecting member 22 can be the same as the oblique angle of the lateral face of the sintered body 12a.

Figure 4F:
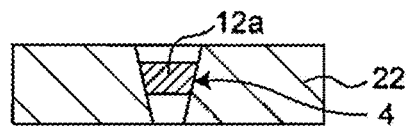
FIG. 4F is a cross-sectional view after inserting a separated sintered body in the through hole of the reflecting member in the manufacturing method of Embodiment 2.

Then a circular truncated cone-shaped sintered body 12a is inserted in the through hole of the reflecting member 22 as shown in FIG. 4F. Because the through hole is formed such that its open upper base is smaller than the upper base of the sintered body 12a and its open lower base is larger than the lower base of the sintered body 12a as described above, the sintered body 12a is held in the intermediate of the through hole so as to create hollows on the upper base side and the lower base side of the through hole as shown in FIG. 4F.

Figure 4G:
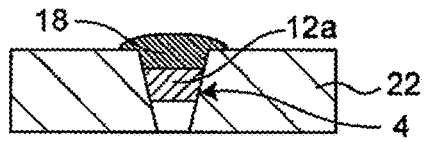
FIG. 4G is a cross-sectional view after disposing glass on the sintered body inserted in the through hole in the manufacturing method of Embodiment 2.

Subsequently, as shown in FIG. 4G, placing the reflecting member such that the lower base side hollow faces up, molten glass 18 is applied on the sintered body 12a in the hollow. In Embodiment 2, the glass 18 contains a phosphor, but it does not have to contain any phosphor, or can contain a light diffusing material.

Figure 4H:
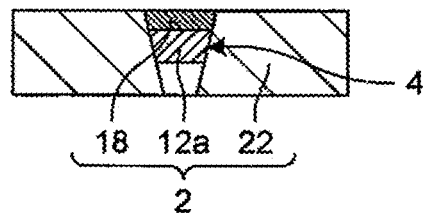
FIG. 4H is a cross-sectional view after polishing the surface of the glass in the manufacturing method of Embodiment 2.

Subsequently, the glass 18 protruding from the through hole is ground and/or polished such that the surface of the glass 18 and the upper face of the reflecting member 22 are coplanar as shown in FIG. 4H.

Figure 4I:
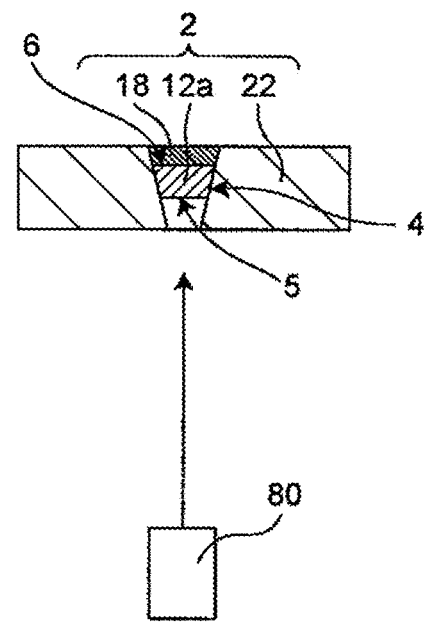
FIG. 4I is a schematic diagram of an application example of a wavelength conversion member provided by the manufacturing method of Embodiment 2.

The wavelength conversion member 2 of Embodiment 2 produced as described above includes a circular truncated cone shaped sintered body 12a and a reflecting member 22 in which the lateral face of the sintered body 12a is covered by the reflecting member 22 while the upper face and/or the lower face of the sintered body 12a are exposed from the reflecting member 22. In this manner, as shown in FIG. 4I, for example, the lower face of the sintered body 12a can be used as a light incidence face 5 through which the light from a light emitting element 80 such as a laser diode enters, and the upper face as the light emission face 6 through which the light subjected to wavelength conversion exits. When using the lower face of the sintered body 12a as the light incidence face 5 and the upper face as the light emission face 6, it is preferable to include a recessed portion removal process subsequent to the recessed portion forming process S2 to remove the recessed portions 7 from the light incidence face 5 and/or the light emission face 6 in order to reduce the light confinement of the light incidence face 5 and the light emission face 6. In Embodiment 2, the grinding and/or polishing of the upper faces of the protrusions 12a and separating the protrusions 12a into individual pieces by removing the base 12b, in the second processing process described above also perform the recessed portion removal process. Furthermore, when using the lower face of the sintered body 12a as the light incidence face 5 and the upper face as the light emission face 6, an antireflection film can be formed on the light incidence face 5 of the sintered body 12a.

In the case of a wavelength conversion member 2 produced by following the processes described above, the light confinement of the light reflecting face 4 of the sintered body 12a covered by the reflecting member 22 is improved by the recessed portions 7 created by acid treatment. Accordingly, when the upper face of the sintered body 12a surrounded by the reflecting member 22 is used as the light emission face 6, a large luminance difference between the light emission face 6 and the reflecting member 22 around the light emission face 6, i.e., the rate of decrease in luminance with respect to the distance from the light emission face 6 can be made sharper in the upper face of the wavelength conversion member 2 (the face that includes the light emission face 6 of the sintered body 12*a* and the area around the upper face of the light emission face 6), thereby producing a clearly distinguishable boundary.

The wavelength conversion member 2 produced as described above can be used, for example, as a lid, or a part of a lid, of a package that houses a light emitting diode or semiconductor laser element, allowing the light from the light emitting diode or semiconductor laser element housed in the package to be output after undergoing wavelength conversion.

Embodiment 3

Figure 5:
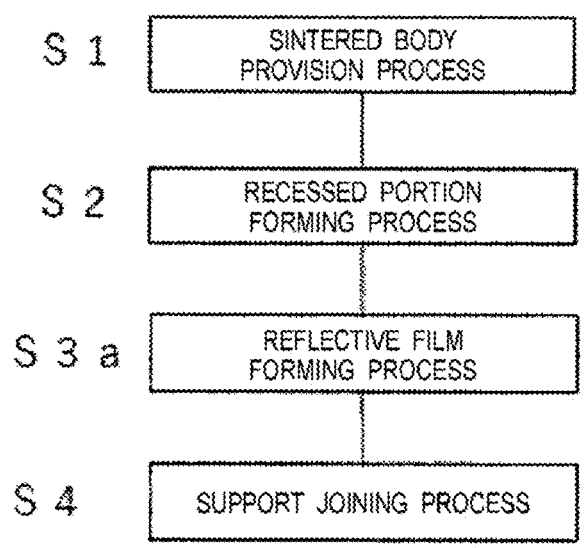
FIG. 5 is a flowchart of a manufacturing method according to Embodiment 3 of the present disclosure.

A method of manufacturing a wavelength conversion member 3 according to Embodiment 3, similar to the methods according to Embodiments 1 and 2, as shown in FIG. 5, includes a sintered body provision process S1 and a recessed portion forming process S2, except that the recessed portion forming process S2 differs from Embodiment 2 by simultaneously shape processing the sintered body 13 and creating recessed portions 7 on the surfaces.

The wavelength conversion member 3 produced by the method of Embodiment 3 allows the light incident on the upper face to undergo wavelength conversion before exiting the upper face, i.e., the same face serves as both the light incidence face 5 and the light emission face 6. Accordingly, the manufacturing method according to Embodiment 3, as shown in FIG. 5, includes a reflective film forming process in which a reflective film 23 is formed on the lower face of the sintered body 13 in place of the reflecting member disposing process S3 of Embodiments 1 and 2.

A method of manufacturing a wavelength conversion member 3 of Embodiment 3 will be explained in detail below.

1. Sintered Body Provision Process S1

In a method of manufacturing a wavelength conversion member 3 of Embodiment 3, a plate shaped formed body is provided and sintered in the sintered body provision process S1 in a similar manner as in Embodiment 2 to provide a phosphor ceramic plate 13 that is a sintered body.

2. Recessed portion Forming Process S2

In the manufacturing method of Embodiment 3, the recessed portion forming process S2 shapes the upper face of a phosphor ceramic plate 13 while creating recessed portions 7 on the shaped surface.

Figure 6A:
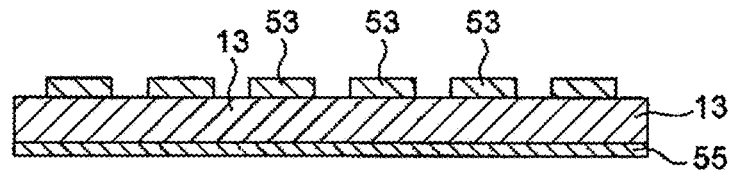
FIG. 6A is a cross-sectional view of a phosphor ceramic plate in which masks are formed on the upper face and a protective film formed on the lower face in the manufacturing method of Embodiment 3.
Figure 6B:
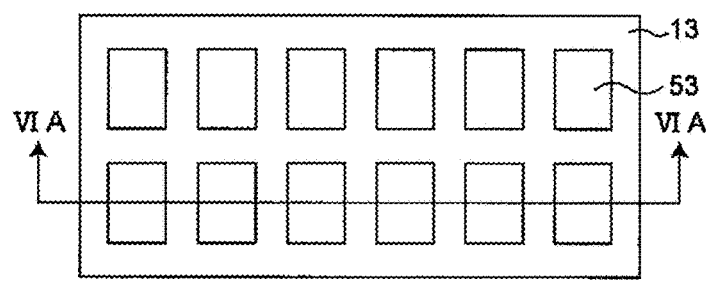
FIG. 6B is a top view of the phosphor ceramic plate shown in FIG. 6A.

Specifically, as shown in FIG. 6A, on the upper face of a phosphor ceramic plate 13, a plurality of masks 53 formed of, for example, $SiO_2$, each quadrangular shaped in a top view, are formed at predetermined intervals. At this time, a protective film 55 formed of, for example, $SiO_2$ can be formed across the entire lower face of the phosphor ceramic plate 13 that is not subject to shape processing. Alternatively, etching can be performed without forming any protective film 55 on the lower face of the phosphor ceramic plate 13, followed by grinding or polishing the lower face provided with recessed portions 7 in a subsequent process. In the case in which the thickness of the phosphor ceramic plate 13 is relatively small, it is preferable to form a protective film 55 because the grinding or polishing of the lower face provided with recessed portions 7 might otherwise crack the phosphor ceramic plate 13. Here, the masks 53 formed on the upper face of the phosphor ceramic plate 13 and the protective film 55 formed on the lower face are not limited to $SiO_2$. For example, SiON, SiN, $Al_2O_3$, AlON, AlN, $ZrO_2$ or the like that cannot be etched by the acid treatment described below can be used.

Figure 6C:
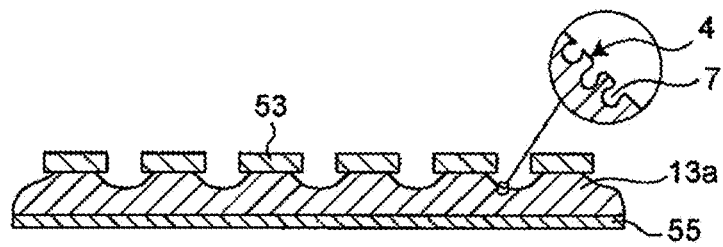
FIG. 6C is a cross-sectional view of the phosphor ceramic plate after forming recessed portions in the manufacturing method of Embodiment 3.

Subsequently, the entire phosphor ceramic plate 13 provided with the masks 53 on the upper face and the protective film 55 on the lower face is acid treated. Similar to Embodiment 1, the acid treatment can be performed in a heated phosphoric acid and sulfuric acid mixture for a predetermined time, followed by washing with water. As explained with reference to Embodiment 1, the acid treatment first dissolves the boundaries between the inorganic particles and the phosphor particles 17 near the surface of the sintered body 13 (phosphor ceramic plate 13), allowing the phosphor particles to break loose, but the inorganic particles formed of aluminum oxide or the like, for example, are also dissolved by the phosphoric acid and sulfuric acid mixture at a certain temperature or higher. Accordingly, the phosphor ceramic at the upper face between the masks 53 is etched off by the acid treatment, and as shown in FIG. 6C, protrusions 13*a* are formed under the masks 53, and a plurality of recessed portions 7 are created in the etched surface. When treated with acid using quadrangular masks 53, for example, because the acid treatment is isotropic etching, each of the protrusions 13*a* formed under the masks 53 has a substantially truncated quadrangular pyramid shape, and a plurality of recessed portions 7 are created in each lateral face of the substantially truncated quadrangular pyramid shaped protrusions 13*a*. Here, by half-cutting the portion of the upper face of the phosphor ceramic plate 13 where the masks 53 are not formed by dicing or using a laser prior to etching, for example, the penetration of acid can be facilitated. This allows for deeper etching as compared to the instance in which no half-cutting is performed. This as a result can further reduce the propagation of light in the phosphor ceramic plate 13, thereby improving the clearly distinguishable boundary of the light emission face.

The upper faces of the substantially truncated quadrangular pyramid shaped protrusions 13*a*, i.e., the faces in contact with the masks 53, and the upper faces of the masks 53 are substantially flat and are suited for use as the light incidence faces of the phosphor ceramic plate 13.

Similar to in Embodiment 1, the mixing ratio of phosphoric acid and sulfuric acid, the heating temperature of the mixture, the processing time, or the like are set so as to form the desired recessed portions 7. Because the acid treatment in Embodiment 3 also shapes the upper face of the phosphor ceramic plate 13, the mixing ratio of phosphoric acid and sulfuric acid, the heating temperature of the mixture, the processing time, or the like can be adjusted by further considering the shapes of the protrusions 13*a* to be formed.

3. Reflective Film Forming Process

Figure 6D:
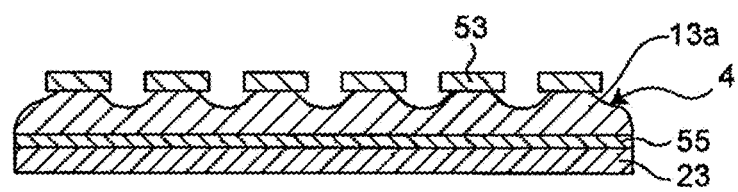
FIG. 6D is a cross-sectional view of the phosphor ceramic plate after forming a reflective film across the entire lower face in the manufacturing method of Embodiment 3.
Figure 6E:
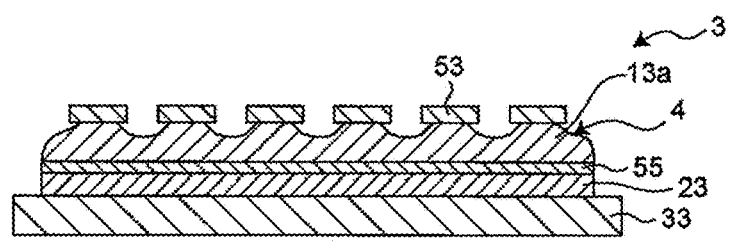
FIG. 6E is a cross-sectional view of the phosphor ceramic plate after disposing a support that supports the phosphor ceramic plate from the lower face side in the manufacturing method of Embodiment 3.

Subsequent to the acid treatment, as shown in FIG. 6D, a reflective film 23 is formed across the entire lower face of the phosphor ceramic plate 13. The reflective film 23 can be formed directly on the lower face of the phosphor ceramic plate 13 after removing the protective film 55, or can be formed on the lower face of the phosphor ceramic plate 13 via the protective film 55 in the case in which the protective film 55 is a light transmissive $SiO_2$ film or the like. In FIG. 6D, the protective film 55 is a light transmissive film, and the reflective film 23 is formed on the lower face of the phosphor ceramic plate 13 via the protective film 55. For the reflective film 23, a multilayer dielectric film such as a DBR (distributed Bragg reflector) and/or a metal film can be used. In the case in which the uppermost layer of the multilayered reflective film 23 is a dielectric film that is a part of a DBR, a film having a refractive index between the refractive index of the uppermost dielectric film and the refractive index of the phosphor particles 17 in the phosphor ceramic plate 13 is preferably formed as the protective film 55. In the case in which the protective film 55 for protecting the phosphor ceramic plate 13 from acid treatment is an $SiO_2$ film or the like that does not satisfy the refractive index conditions, the protective film 55 can be removed, and another protective film 55 that satisfies the conditions can be formed. This allows the light from the phosphor particles 17 to be totally reflected off the interface between the protective film 55 and the uppermost dielectric layer in the case in which the phosphor particles 17 are part of the lower face of the phosphor ceramic plate 13. This can reduce the amount of the light from the phosphor particles 17 that directly enters at a relatively high incident angle, and thus can reduce the number of layers of the DBR as compared to the case in which such a protective film 55 is not provided. The thicknesses of the protective film 55 and the uppermost dielectric film of the DBR can be made larger than the wavelength of the light to be reflected, for example, at least 800 nm. The thickness of the protective film 55 can be made larger than the thickness of the uppermost dielectric film of the DBR. Examples of materials for use as dielectric films making up the DBR include $Nb_2O_5$, $Ta_2O_5$, $ZrO_2$, $SiO_2$, and the like. For example, in the case in which the uppermost dielectric film of the DBR is $SiO_2$, and the phosphor particles 17 are YAG phosphor particles, examples of materials for use as a protective film 55 having a refractive index falling between the refractive indices of the two include $Al_2O_3$, MgO, or $Ga_2O_5$. By using, for the protective film 55, any of these materials that have higher thermal conductivity than the materials for forming a DBR, an improved heat dissipation effect can also be expected. In the case of allowing light to be totally reflected off the interface between the protective film 55 and the uppermost dielectric film, the thickness of the protective film 55 can be larger than the suitable thickness calculated by an optical simulation. This is believed to reduce the probability of nonoccurrence of total reflection at the interface between these layers.

4. Support Joining Process

Here, a support 33 that supports the phosphor ceramic plate 13 from the lower face side is joined, for example, to the reflective film 23. The support 33 is formed of, for example, aluminum nitride or copper. The inclusion of the support joining process is optional, as the support 33 is for supporting or protecting the phosphor ceramic plate 13 that is joined as needed.

When the light that excites the phosphor particles 17 enters the wavelength conversion member 3 of Embodiment 3 thus provided through the upper faces of the protrusions 13a via the light transmissive masks 53, at least one portion of the incident light excites the phosphors, the excited phosphors emit light having a different wavelength from the wavelength of the incident light, and the light is externally output via the upper faces of the protrusions 13a and the masks 53. The masks 53 can be removed following the recessed portion forming process S2.

In the manner described above, the wavelength conversion member 3 of Embodiment 3 converts the wavelength of at least a portion of the light that entered the upper faces of the protrusions 13a via the masks 53 before outputting the light through the upper faces of the protrusions 13a and the masks 53. At this point, because the outer lateral faces of the protrusions 13a are provided with recessed portions 7, the protrusions 13a can confine the light by reducing the output of light from the lateral faces of the protrusions 13a. This can increase both the luminance difference between the light emission faces 6 and the areas outward therefrom, and the wavelength conversion efficiency.

A wavelength conversion member 3 of Embodiment 3 can be adapted to convert the wavelength of at least a portion of the incident light before being output, while allowing the remaining portion of the incident light to maintain the same wavelength, and being reflected and/or scattered in the phosphor ceramic plate 13 before being output. In this case, mixed color light that combines the light having the same wavelength as that of the incident light and the wavelength-converted light having a wavelength different from the incident light will be output.

The wavelength conversion member 3 of Embodiment 3 thus produced, in combination with an excitation light source, such as a light emitting diode or semiconductor laser element, can be used in a projector, a lighting fixture, an automotive light, and the like. Furthermore, by employing a support 33 having a heat dissipating function, the wavelength conversion member 3 can be used as a light source outputting a large amount of light.

Figure 6F:
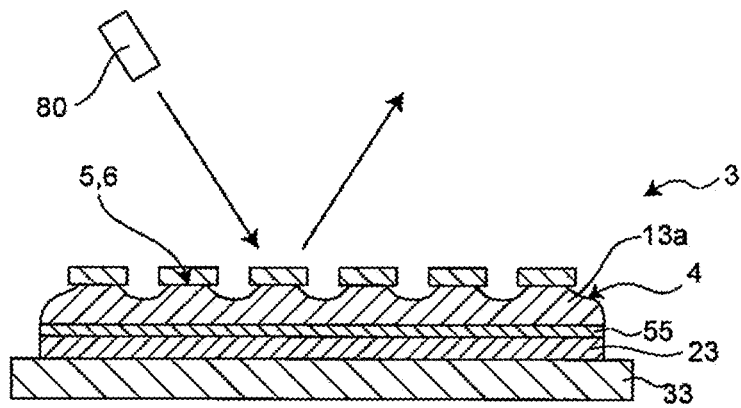
FIG. 6F is a schematic diagram of an application example of a wavelength conversion member produced by the manufacturing method of Embodiment 3.

FIG. 6F schematically shows an application example of a light emitting device that includes a wavelength conversion member 3 of Embodiment 3. The light emitting device includes a wavelength conversion member 3 and a light emitting element 80, which is a laser diode that irradiates a laser beam on the protrusions 13a of the wavelength conversion member 3. In the light emitting device shown in FIG. 6F, the laser beam emitted by the light emitting element 80 enters the upper faces of the protrusions 13a, and the wavelength of at least a portion of the light is converted into light of a different wavelength from that of the incident light before being output through the upper faces of the protrusions 13a. Because the outer lateral faces of the protrusions 13a are light reflecting faces 4 with improved light confinement, leakage of light from the outer lateral faces of the protrusions 13a can be reduced, and the wavelength of the laser beam entering through the upper faces of the protrusions 13a can be efficiently converted before being output through the upper faces of the protrusions 13a.

FIG. 6F shows that a laser beam from one light emitting element 80 irradiates on one protrusion 13a. However, for example, the light emitting device can be constructed with a plurality of light emitting elements 80 that individually irradiate the corresponding protrusions 13a (construction 1) or one light emitting element 80 that irradiates the plurality of protrusions 13a (construction 2).

Specifically, in the case of construction 1, the number of light emitting elements 80 can be different from the number of protrusions 13a depending on the application. In other words, the construction 1 can be adapted such that one light emitting element 80 irradiates laser beams on two or more protrusions 13a. Alternatively, the construction 1 can be adapted such that two or more light emitting elements 80 irradiate laser beams on one protrusion 13a.

In the case of construction 2, depending on the application, the construction 2 can be adapted such that the laser beam of one light emitting element 80 can be optically spread out to collectively irradiate multiple protrusions 13a. Alternatively, the construction 2 can be adapted such that the protrusions 13a are successively irradiated by laser beam scanning by using, for example, a mirror whose direction can be controlled.

Test Example

As a test example, a sintered body that included $Al_2O_3$ particles as inorganic particles and YAG (yttrium aluminum garnet) phosphor particles as phosphor particles was provided, and the upper face of the sintered body was acid treated. The light transmittance of the upper face of the sintered body was evaluated.

Specifically, for the inorganic particles, aluminum oxide particles having an average particle size of 0.5 μm, and for the phosphor particles, YAG phosphor particles having an average particle size of 5 μm, were provided. The aluminum oxide particles and the YAG particles were mixed at the ratio of 8:2.

They were mixed for 24 hours using a wet mixing process.

Then the mixed powder was formed to have a columnar shape.

A green sheet was primarily formed by doctor blading, followed by the secondary forming to achieve a columnar shape using a cutter.

Then the formed body was sintered.

Following the primary sintering by pressureless sintering in an ambient air at 1400° C. for 5 hours, annealing (heat treatment) was performed at 1400° C. in an inert gas ambient for 10 hours.

Subsequent to sintering, the sintered body was acid treated to form a plurality of recessed portions in the upper face of the sintered body.

The acid treatment was performed by heating a mixture of phosphoric acid and sulfuric acid mixed at the ratio of 1:3 to 180° C., placing the sintered body in the mixture, subsequently placing the sintered body to another mixture of the same composition heated to 300° C. for 10 minutes, followed by placing the sintered body back in the 180° C. mixture and gradually reducing the temperature before removing the sintered body.

After washing the acid treated sintered body with water, light was irradiated to enter the sintered body through the lower face, and the transmittance of the upper face of the sintered body was measured.

The transmittance was measured by using a spectrophotometer.

Furthermore, a comparative sample was similarly provided up to annealing, and the transmittance of the sintered body that was not acid treated was measured.

As a result, the transmittance of the upper face of the test example sintered body at 540 nm was 55%, whereas the transmittance of the upper face of the comparative sintered body at 540 nm was 60%. It was found from the transmittance of the upper face of the sintered body of the test example being lower than the transmittance of the upper face of the comparative sintered body that the light confinement of the upper face of the sintered body of the test example was higher as compared to the comparative sample.

FIG. 7A is a cross-sectional micrograph of the sintered body 11a provided in a similar manner as in the test example to which a reflecting member 21a was formed on the light reflecting face 4. It was confirmed, as shown in FIG. 7A, that the distribution of the phosphor particles 17 in the light reflecting face 4 was lower than the distribution of the phosphor particles 17 on the inside of the sintered body 11a. It was also confirmed that the reflecting member 21a penetrated the recessed portions 7 of the sintered body 11a, forming protrusions 8 of the reflecting member 21a. FIG. 7B is a cross-sectional micrograph of the sintered body shown in FIG. 7A from which the reflecting member was removed in order to make the shape of the light reflecting face 4 more easily understood. It was confirmed, as shown in FIG. 7B, that pores 9 remained between the recessed portions 7 of the sintered body 11a and the protrusions 8 of the reflecting member 21a. Here, the reflecting member 21a was formed by slip casting in which a slurry for forming the reflecting member 21a was allowed to flow into the space around the sintered body 11a, dried, and heat treated in the air ambient at 1400° C. for 1 hour.

Figure 7C:
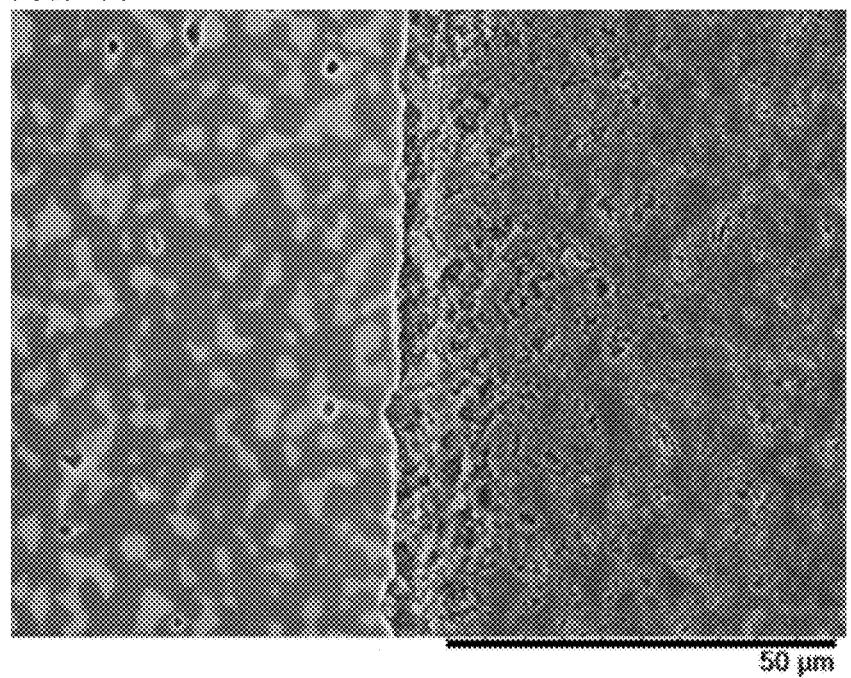
FIG. 7C is a cross-sectional micrograph of a sintered body provided in a similar manner as in the comparative example after forming a reflecting member on the light reflecting face.

In comparison, in the case of forming a reflecting member on the light reflecting face of the comparative sintered body not acid treated, as shown in FIG. 7C, no difference was observed between the distribution of the phosphor particles in the light reflecting face and the distribution of the phosphor particles on the inside of the sintered body. No recessed portions penetrated by the reflecting member similar to those confirmed in the test example were found.

What is claimed is:

1. A method of manufacturing a wavelength conversion member that comprises a sintered body having a light incidence face, a light emission face, and a light reflecting face different from the light incidence face and the light emission face, the method comprising:
   providing a sintered body containing inorganic particles and phosphor particles; and
   forming a plurality of recessed portions on the light reflecting face of the sintered body, which comprises acid treating the sintered body.

2. The method of manufacturing a wavelength conversion member according to claim 1, wherein:
   in the step of forming the plurality of recessed portions, a plurality of recessed portions are created in the light incidence face and/or the light emission face of the sintered body; and
   the method further comprises, subsequent to the step of forming the plurality of recessed portions, removing the recessed portions of the light incidence face and/or the light emission face.

3. The method of manufacturing a wavelength conversion member according to claim 1, wherein:
   the light reflecting face is an outer lateral face of the sintered body; and
   the method further comprises disposing a reflecting member in contact with the outer lateral face such that the light incidence face and the light emission face are exposed from the reflecting member.

4. The method of manufacturing a wavelength conversion member according to claim 3, wherein:
   the sintered body has a columnar shape; and
   the step of disposing the reflecting member comprises:
      integrally forming a powder for forming the reflecting member so as to surround the sintered body, and
      integrally sintering the powder and the sintered body.

5. The method of manufacturing a wavelength conversion member according to claim 4, wherein:
   in the step of providing the sintered body, two or more of the sintered bodies are provided;
   the step of disposing the reflecting member comprises:
      integrally forming a powder for forming the reflecting member so as to surround the sintered bodies respectively provided with the plurality of recessed portions, and
      providing a wavelength conversion member block by integrally sintering the powder and the sintered bodies, and
      dividing the wavelength conversion member block into individual wavelength conversion members each including one or more sintered bodies.

6. The method of manufacturing a wavelength conversion member according to claim 3, wherein:
   the step of disposing he reflecting member includes:

providing a reflecting member having a hole corresponding to the sintered body, and
inserting the sintered body provided with the plurality of recessed portions in the hole of the reflecting member.

7. The method of manufacturing a wavelength conversion member according to claim 1, wherein:
in the step of forming the recessed portions, masks are formed on the light incidence face and/or the light emission face of the sintered body, and a plurality of recessed portions are created in the surface exposed from the masks.

8. The method of manufacturing a wavelength conversion member according to claim 1, wherein:
the light incidence face and the light emission face share the same face.

9. The method of manufacturing a wavelength conversion member according to claim 1, wherein:
the phosphor particles comprise a YAG phosphor.

10. The method of manufacturing a wavelength conversion member according to claim 1, wherein:
the inorganic particles comprise aluminum oxide.

11. The method of manufacturing a wavelength conversion member according to claim 1, wherein:
a particle size of the inorganic particles is smaller than a particle size of the phosphor particles.

12. The method of manufacturing a wavelength conversion member according to claim 1, wherein:
the acid treatment is performed using a solution that results in a dissolution rate of the phosphor particles being higher than a dissolution rate of the inorganic particles.

13. The method of manufacturing a wavelength conversion member according to claim 3, further comprising:
after disposing the reflecting member, grinding or polishing surfaces exposed from the reflecting member in part or in whole to remove recessed portions from the light incidence face and the light emission face.

14. The method of manufacturing a wavelength conversion member according to claim 3, wherein:
the reflecting member is formed with a material that includes the same material as the inorganic particles of the sintered body.

15. The method of manufacturing a wavelength conversion member according to claim 4, wherein:
the powder for forming the reflecting member penetrates at least one of the recessed portions of the sintered body.

16. The method of manufacturing a wavelength conversion member according to claim 1, wherein:
the light reflecting face extends from the light incidence face to the light emission face.

* * * * *